US007987584B2

(12) United States Patent
Barna et al.

(10) Patent No.: US 7,987,584 B2
(45) Date of Patent: Aug. 2, 2011

(54) ARTICLE EXTRACTION / INSERTION TOOL AND ASSEMBLY

(75) Inventors: Kyle Steven Barna, Poughkeepsie, NY (US); William Louis Brodsky, Binghamton, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 850 days.

(21) Appl. No.: 12/025,099

(22) Filed: Feb. 4, 2008

(65) Prior Publication Data
US 2009/0193641 A1 Aug. 6, 2009

(51) Int. Cl.
B23P 19/04 (2006.01)
B23P 19/00 (2006.01)
H01R 13/62 (2006.01)

(52) U.S. Cl. .............................. 29/759; 29/259; 439/159

(58) Field of Classification Search ............ 29/244–268, 29/426.1–426.5, 428–525.15, 759; 439/152–160
See application file for complete search history.

(56) References Cited

U.S. PATENT DOCUMENTS

| 3,137,065 | A | * | 6/1964 | Konstantine | 29/278 |
| 3,180,670 | A | * | 4/1965 | Pryde | 294/15 |
| 3,617,083 | A | * | 11/1971 | Koppensteiner et al. | 294/15 |
| 3,701,558 | A | * | 10/1972 | Baker | 294/33 |
| 3,759,559 | A | * | 9/1973 | Yuska | 294/15 |
| 3,853,379 | A | * | 12/1974 | Goodman et al. | 439/261 |
| 3,867,753 | A | * | 2/1975 | Urban et al. | 29/764 |
| 3,896,533 | A | * | 7/1975 | Ullman et al. | 227/140 |
| 3,903,576 | A | * | 9/1975 | Stein | 29/764 |
| 4,223,934 | A | * | 9/1980 | Cauceglia et al. | 294/15 |
| 4,377,907 | A | * | 3/1983 | Bertellotti et al. | 29/747 |
| 4,385,438 | A | * | 5/1983 | Bertellotti et al. | 29/764 |
| 4,858,309 | A | * | 8/1989 | Korsunsky et al. | 29/764 |
| 4,952,161 | A | | 8/1990 | Komatsu | |
| 5,011,420 | A | | 4/1991 | Sakamoto | |
| 5,051,101 | A | | 9/1991 | Komatsu | |
| 5,299,089 | A | | 3/1994 | Lwee | |
| 5,401,176 | A | | 3/1995 | Lwee | |
| 5,655,918 | A | | 8/1997 | Soh | |
| 5,836,775 | A | | 11/1998 | Hiyama et al. | |
| 5,853,297 | A | * | 12/1998 | Moulton et al. | 439/327 |
| 5,907,354 | A | | 5/1999 | Cama et al. | |
| RE37,265 | E | | 7/2001 | Lwee | |

(Continued)

*Primary Examiner* — Derris H Banks
*Assistant Examiner* — Kaying Kue
(74) *Attorney, Agent, or Firm* — John E. Campbell; Ira D. Blecker

(57) ABSTRACT

A tool assembly for removing an article from, or inserting an article onto, a printed circuit board which includes a tool housing having a handle portion and an article receiving portion, a plate slidable within the housing, the plate having a handle portion at a first end adjacent to the handle portion of the housing and two receiving portions at a second end, and two lever arms within the housing, each lever arm having a first end pinned to the housing and a second end of each lever arm inserted into the receiving portion of the plate such that each of the lever arms pivots about the pinned first end upon movement of the plate. The tool further comprises a pair of flexible rods located in respective recessed channels on either side of the article receiving portion, with one end of the flexible rods affixed to a first end of each of the lever arms, each of the flexible rods having a free end for interacting with an article retention device. The tool assembly may also include a tool guide for aligning the tool with a desired portion of a printed circuit board.

16 Claims, 6 Drawing Sheets

U.S. PATENT DOCUMENTS

| | | |
|---|---|---|
| 6,287,143 B1 | 9/2001 | Lwee |
| 6,402,210 B1 * | 6/2002 | Rhinehart ....................... 294/15 |
| 7,344,402 B2 * | 3/2008 | Langgood et al. ............ 439/328 |
| 7,377,797 B2 * | 5/2008 | Tsai ............................... 439/159 |
| 7,396,244 B1 * | 7/2008 | Barna et al. ................... 439/159 |
| 7,473,115 B2 * | 1/2009 | Yu et al. ........................ 439/188 |
| 7,517,239 B1 * | 4/2009 | Ju ................................... 439/159 |
| 7,814,634 B2 * | 10/2010 | Francis et al. ................ 29/426.5 |
| 2006/0185159 A1 * | 8/2006 | Correll et al. ................... 29/758 |

\* cited by examiner

ARTICLE EXTRACTION / INSERTION TOOL AND ASSEMBLY

FIELD OF THE INVENTION

The present invention relates to a tool for removing an article from, or inserting an article on, a printed circuit board. In particular, the present invention relates to a tool for removing a memory module from, or inserting a memory module on, a printed circuit board.

BACKGROUND OF THE INVENTION

As technology advances, computers, as well as other electronic devices, are required to perform more complicated tasks. In order to respond, the circuitry found in the computers has become more complex. The complexity of the circuitry combined with the limited space available in the computer has caused the need for the circuitry to be densely spaced. The high density packaging requirements of the circuitry has caused problems in the design and engineering of the terminals and connectors to be used. In other words, miniaturized connectors must be used to perform the various electrical functions required.

However, this high density spacing of the connectors has caused problems in the repair and replacement of the parts. It is difficult to access or remove memory modules (for example, dual inline memory modules or DIMMs) and the like from the connectors due to the high density of the connectors. Consequently, various methods are employed to remove the memory modules from the connector. These methods can result in damage to the memory modules, which is an unacceptable result. The removal of the memory modules is complicated by the fact that the memory modules are latched to the connector, so that removal of the memory modules from the connector requires that the latches must be disengaged.

In order to insure that the repair and replacement of the memory modules does not damage the memory modules, it is essential that an extraction tool be used. There are various extraction tools which are on the market, however these tools are complicated, and consequently expensive to manufacture.

Another problem associated with some of the prior art tools is the fact that the extraction tools do not have the capability to unlatch the latching means of a connector. In other words, if the memory modules are latched to the connectors, the memory modules must be unlatched by hand, and then the extraction tool may be used. This process is time consuming and can damage the boards.

Various solutions have been proposed for handling memory modules. Korsunsky et al. U.S. Pat. No. 4,858,309, the disclosure of which is incorporated by reference herein, discloses an extraction tool for removing a printed circuit board from a connector. Correll et al. U.S. Patent Application Publication US 2006/0185159, the disclosure of which is incorporated by reference herein, discloses a memory card insertion tool. Komatsu U.S. Pat. No. 4,952,161, Sakamoto U.S. Pat. No. 5,011,420, Komatsu U.S. Pat. No. 5,051,101, Lwee U.S. Pat. No. 5,299,089, Lwee U.S. Pat. No. 5,401,176, Soh U.S. Pat. No. 5,655,918, Hiyama et al. U.S. Pat. No. 5,836,775, Cama et al. U.S. Pat. No. 5,907,354, Lwee U.S. Pat. No. 6,287,143 and Lwee U.S. Reissue Patent RE37,265, the disclosures of which are incorporated by reference herein, disclose various connectors which receive memory cards or other printed circuit board. Some of the connectors have ejector mechanisms for ejecting the card or board.

It would be beneficial to have an extraction tool which unlatches and removes the memory modules in one continuous motion. It would also be beneficial to have an insertion tool for inserting memory modules in very tight spaces.

BRIEF SUMMARY OF THE INVENTION

The advantages of the present invention can be achieved by providing, in a first aspect of the present invention, a tool for removing an article from, or inserting an article onto, a printed circuit board, the tool comprising:

a housing having a handle portion and an article receiving portion;

a plate slidable within the housing, the plate having a handle portion at a first end adjacent to the handle portion of the housing and two receiving portions at a second end;

two lever arms within the housing, each lever arm having a first end pinned to the housing and a second end of each lever arm inserted into the receiving portion of the plate such that each of the lever arms pivots about the pinned first end upon movement of the plate;

a first flexible rod located in a recessed channel on one side of the article receiving portion in the housing, the first flexible rod affixed to the first end of one of the lever arms and a second flexible rod located in a recessed channel on another side of the article receiving portion in the housing, the second flexible rod affixed to the first end of the other of the lever arms, each of the flexible rods having a free end for interacting with an article retention device;

wherein, in operation, movement of the plate caused by gripping the handle portions of the housing and plate causes the lever arms to move in a first direction and the flexible rods in a second direction so as to cause the flexible rod free ends to interact with the article retention device.

According to a second aspect of the present invention, there is provided a tool assembly for removing an article from, or inserting an article onto, a printed circuit board, the tool comprising:

a tool comprising:

a housing having a handle portion and an article receiving portion;

a plate slidable within the housing, the plate having a handle portion at a first end adjacent to the handle portion of the housing and two receiving portions at a second end;

two lever arms within the housing, each lever arm having a first end pinned to the housing and a second end of each lever arm inserted into the receiving portion of the plate such that each of the lever arms pivots about the pinned first end upon movement of the plate;

a first flexible rod located in a recessed channel on one side of the article receiving portion in the housing, the first flexible rod affixed to the first end of one of the lever arms and a second flexible rod located in a recessed channel on another side of the article receiving portion in the housing, the second flexible rod affixed to the first end of the other of the lever arms, each of the flexible rods having a free end for interacting with an article retention device;

and a tool guide comprising a pair of slotted members placed proximate to the article to be removed from or inserted on the printed circuit board;

wherein, in operation, the tool is aligned with a desired portion of the printed circuit board by use of the tool guide and then the tool is operated by movement of the plate caused by gripping the handle portions of the housing and plate to cause the lever arms to move in a first direction and the flexible rods in a second direction so as to cause the flexible rod free ends to interact with the article retention device.

According to a third aspect of the present invention, there is provided a method for removing an article from a printed circuit board with a tool comprising a housing having a handle portion and an article receiving portion; a plate slidable within the housing, the plate having a handle portion at a first end adjacent to the handle portion of the housing and two receiving portions at a second end; two lever arms within the housing, each lever arm having a first end pinned to the housing and a second end of each lever arm inserted into the receiving portion of the plate such that each of the lever arms pivots about the pinned first end upon movement of the plate; a first flexible rod located in a recessed channel on one side of the article receiving portion in the housing, the first flexible rod affixed to the first end of one of the lever arms and a second flexible rod located in a recessed channel on another side of the article receiving portion in the housing, the second flexible rod affixed to the first end of the other of the lever arms, each of the flexible rods having a free end for interacting with an article retention device, the method comprising the steps of:

aligning the tool with a predetermined position on the printed circuit board wherein an article is to be removed from the printed circuit board;

gripping the handle portions of the housing and plate causing the lever arms to move in a first direction and the flexible rods in a second direction, the free ends of the flexible rods pressing down on an article retention device on the printed circuit board;

receiving the article from the article retention device by the housing article receiving portion; and then removing the tool and article from the printed circuit board.

According to a fourth aspect of the present invention, there is provided a method for removing an article from a printed circuit board with a tool comprising a housing having a handle portion and an article receiving portion; a plate within the housing and having a handle portion, the method comprising the steps of:

placing an insert in the housing article receiving portion to reduce a size of the housing article receiving portion;

placing an article in the housing article receiving portion;

aligning the tool with a predetermined position on the printed circuit board wherein the article is to be inserted on the printed circuit board;

gripping the handle portions of the housing and plate; and inserting the article on the printed circuit board.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
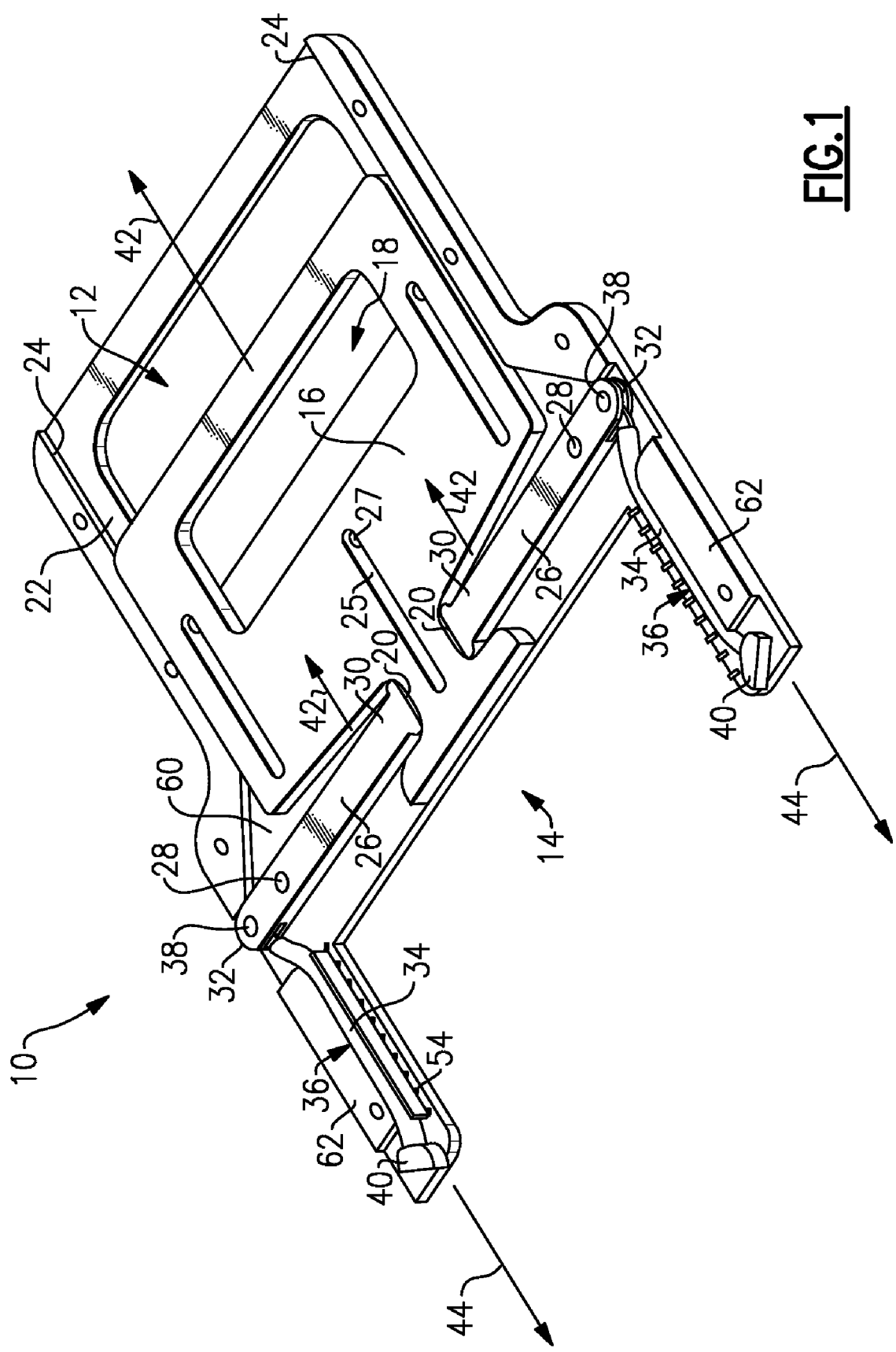
FIG. 1 is a perspective view of the article extraction/insertion tool according to the present invention.

Referring to the Figures in more detail, and particularly referring to FIG. 1, there is shown the article extraction/insertion tool 10 according to the present invention. The tool 10 is specially adapted for removing an article from, or inserting an article onto, a printed circuit board.

In one particularly preferred embodiment of the present invention, the article to be inserted or removed is a memory module. As noted above, the spacing of memory modules is very tight so that memory modules can only be extracted or inserted with great difficulty without damaging the memory module, the connector or surrounding memory modules. The present invention greatly facilitates the safe extraction and/or insertion of such memory modules.

Figure 2:
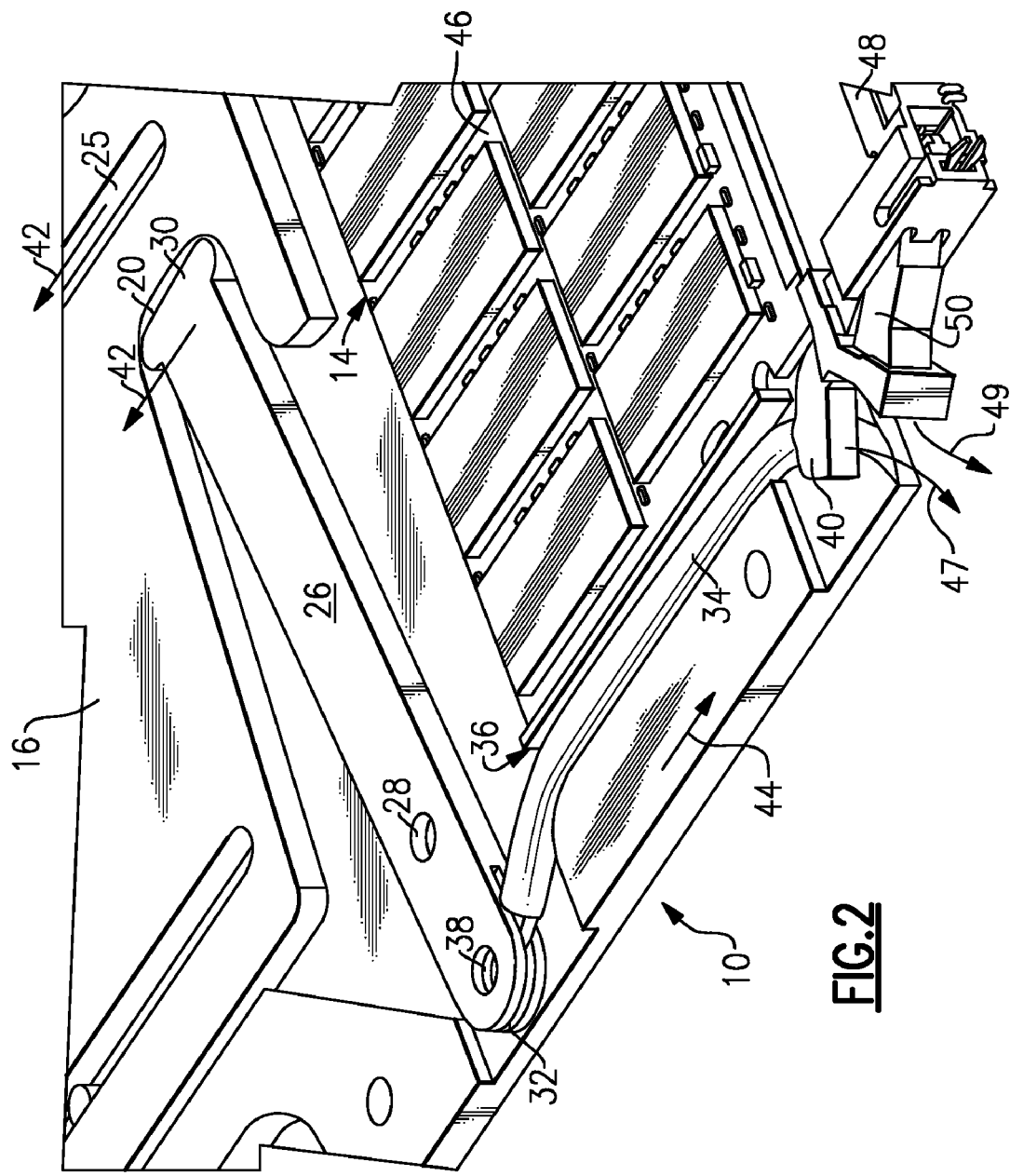
FIG. 2 is an enlarged perspective view of the interaction between the flexible rod according to the present invention and an article retention device during extraction of an article from a printed circuit board.

Referring again to FIG. 1, the tool 10 includes housing 22 having a handle portion 12 and an article receiving portion 14. One side of the housing has been removed so that the inner workings of the tool 10 can be viewed. The housing 22 essentially consists of a main body 60 and a pair of legs 62 which make up the article receiving portion 14 so the article is captured by the pair of legs 62 (as shown in FIG. 2 to be discussed hereafter). The tool 10 further comprises a plate 16 which is slideable within the housing 20. Housing 22 includes guides 24 which guide the movement of plate 16. Plate 16 also contains a slot 25 which meshes with pin 27 on the housing 22 to facilitate the sliding movement of plate 16. Plate 16 includes a handle portion 18 and two receiving portions 20. Handle portion 18 of the plate 16 is adjacent to handle portion 12 of housing 22. Handle portion 12 of housing 22 is larger than handle portion 18 of plate 16 so as to facilitate the gripping of handle portion 18 within handle portion 12.

Figure 7:
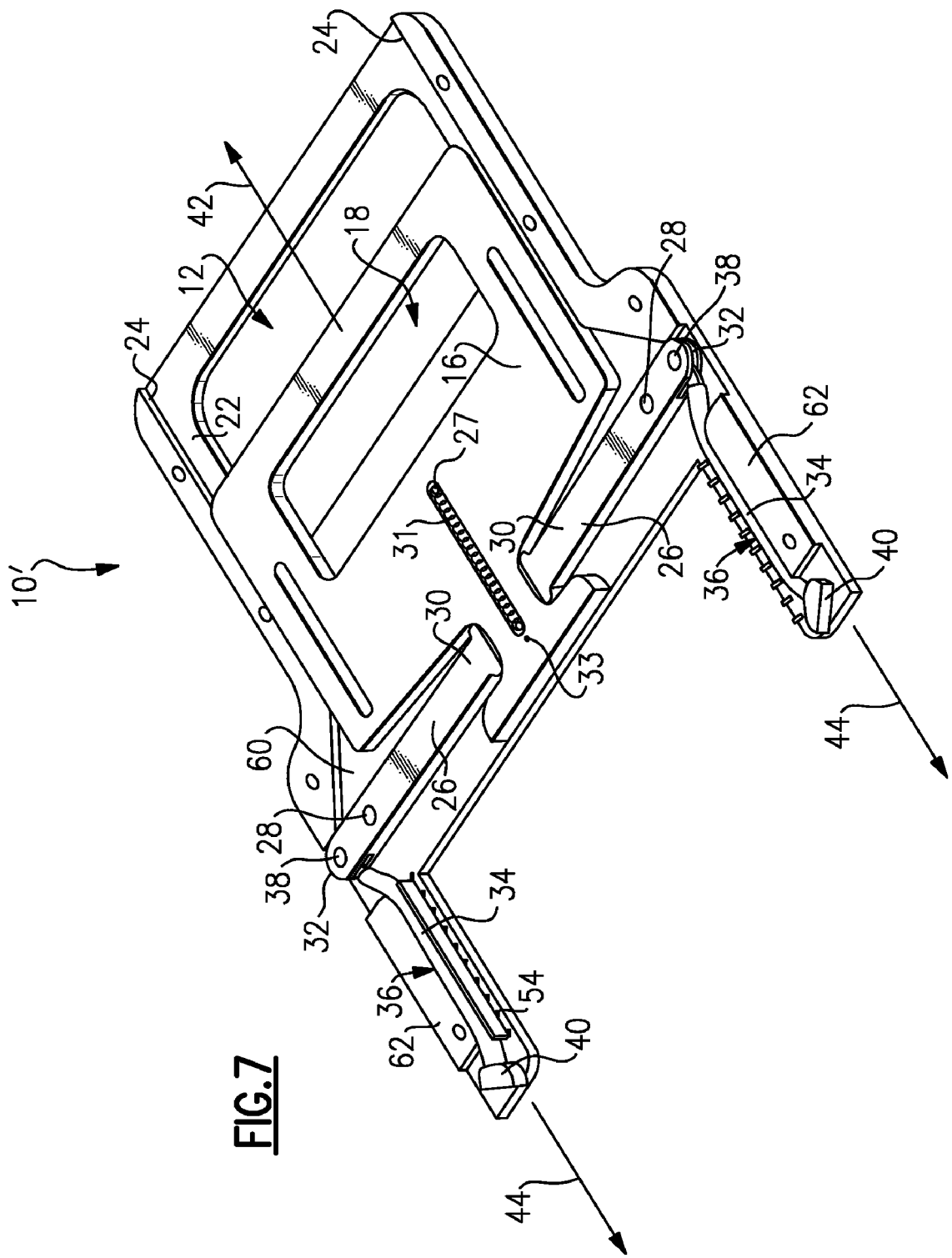
FIG. 7 is a perspective view of the article extraction/insertion tool according to a second embodiment of the present invention.

In a second preferred embodiment of the present invention as shown in FIG. 7, the tool 10' may comprise a spring 31 connected between the plate 16 and housing 22. The spring 31 may be connected to pin 27 on the housing 22 and pin 33 on the plate 16. In operation, the plate handle portion 18 is pulled upwardly in the direction of arrow 42 which compresses spring 31. Upon releasing the handle portion 18, the spring 31 resets the plate 16 to its original position.

The embodiments of the tools 10, 10' according to the present invention would normally have a cover to protect the inner workings of the tools 10, 10'. The cover, however, is not shown for clarity.

Referring back to FIG. 1, the tool 10 further comprises two lever arms 26 within the housing 22. Each lever arm 26 has a first end 32 pinned 28 to the housing 22 and a second end 30 inserted in the receiving portion 20 of the plate 16. It should be noted that while the lever arm 26 is "pinned" at 28, the lever arm 26 is able to pivot about the pin 28.

Lastly, the tool 10 comprises flexible rods 34 located in recessed channels 36 of housing 22. There is one flexible rod 34 located on each side of the article receiving portion 14 in leg 62. Each of the flexible rods 34 are affixed to the first end 32 at 38 of lever arms 26. Each of the flexible rods 34 has a free end for interacting with an article retention device, as will be seen thereafter. The importance of the flexible rods 34 will be discussed in more detail hereafter.

All of the various components of the tool 10 should be made of tough, durable materials. Except for the pivot pins, which are made of a suitable metal, the remainder of the components (i.e., the housing 22, plate 16, lever arms 26 and flexible rods 34) of the tool 10 may be made from polycarbonate materials, ABS plastic, anti-static plastics or metallic materials.

The tool 10 is operated by gripping handle portions 18 and 12 of the plate 16 and housing 22, respectively, which causes the lever arms 26 to move in a first direction, indicated by arrows 42, and the flexible rods 34 to move in a second direction, indicated by arrows 44. The movement of flexible rods 34 in direction of arrows 44 causes the flexible rods free ends 40 to interact with the article retention device as can be seen in FIG. 2.

Referring now to FIG. 2, the article 46, such as a memory module, is shown in a connector 48 on a printed circuit board (not shown). The connector 48 has latches 50 on either side (only one side is shown in FIG. 2) to lock the article 46 in the connector 48. To remove the article 46 from the connector 48, it is necessary to press down on the latches allowing article 46 to move upward. As shown in FIG. 2, the article 46 is gripped by the article receiving portion 14 of the housing 22. When the tool 10 is operated, plate 16 is slid in the direction of arrow 42 which in turn causes end 32 of lever arm 26 to likewise move in the direction of arrow 42. Simultaneously, end 32 of lever arm 26 pivots about pin 28 to force flexible rod 34 in the direction of arrow 44. Then, free end 40 of flexible rod 34 forces latch 50 downwardly in the direction of arrow 44 to unlock the article 46. Tool 10 may now be moved away from the connector 48 and the printed circuit board to safely remove the article from the connector 48.

An important feature of the present invention is the flexible rods 34 and their cooperation with the rest of the tool 10. Still referring to FIG. 2, when the flexible rods 34 are moved in the direction of arrow 44, free end 40 of flexible rod 34 is caused to move along arc 47 which in turn causes latch 50 to similarly move along arc 49. In this manner, the movement of free end 40 of flexible rod 34 essentially duplicates the natural movement of the unlatching of latch 50, thereby making the unlatching step easy and predictable.

Figure 3:
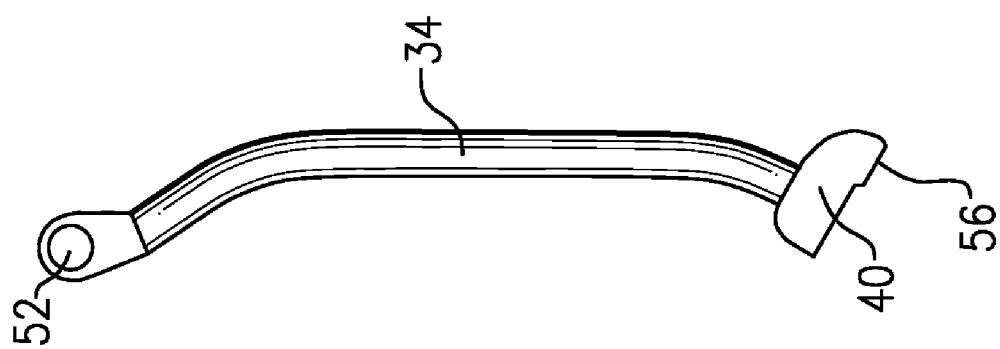
FIG. 3 is a plan view of a flexible rod according to the present invention.

Referring now to FIG. 3, the flexible rod 34 is shown in greater detail. The flexible rod 34 is a molded rod which may be made out of a variety of materials such as polycarbonate and the like as mentioned above. Portion 52 of the flexible rod 34 is affixed to the lever arm 26. Free end 40 of flexible rod 34 is preferably "geared" so that it can reliably mesh with latch 50 to open connector 48. By "geared", it is meant that free end 40 has teeth 56 which mesh with teeth on latch 50.

Figure 4:
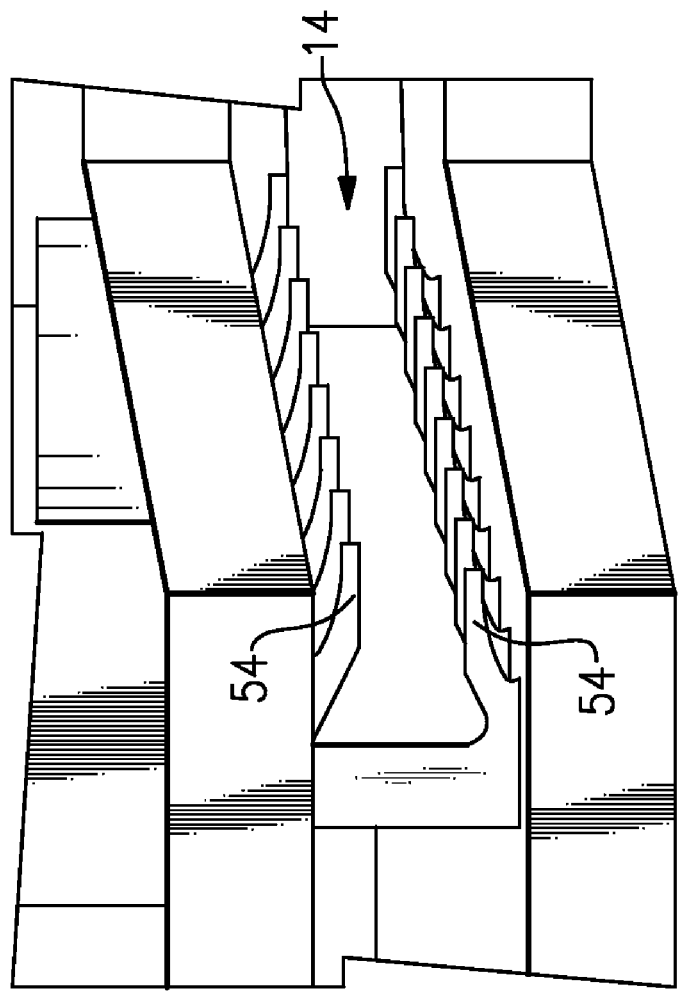
FIG. 4 is an enlarged perspective view of interlocking friction teeth in the housing article receiving portion according to the present invention.

Referring back to FIG. 1, the article receiving portion 14 has interlocking friction teeth 54 to hold the article 46 in place in the article receiving portion 14. The interlocking friction teeth 54 are best shown in FIG. 4. By arranging the interlocking friction teeth 54 in such a manner, the article 46 is firmly held by the opposed interlocking friction teeth 54.

Figure 5:
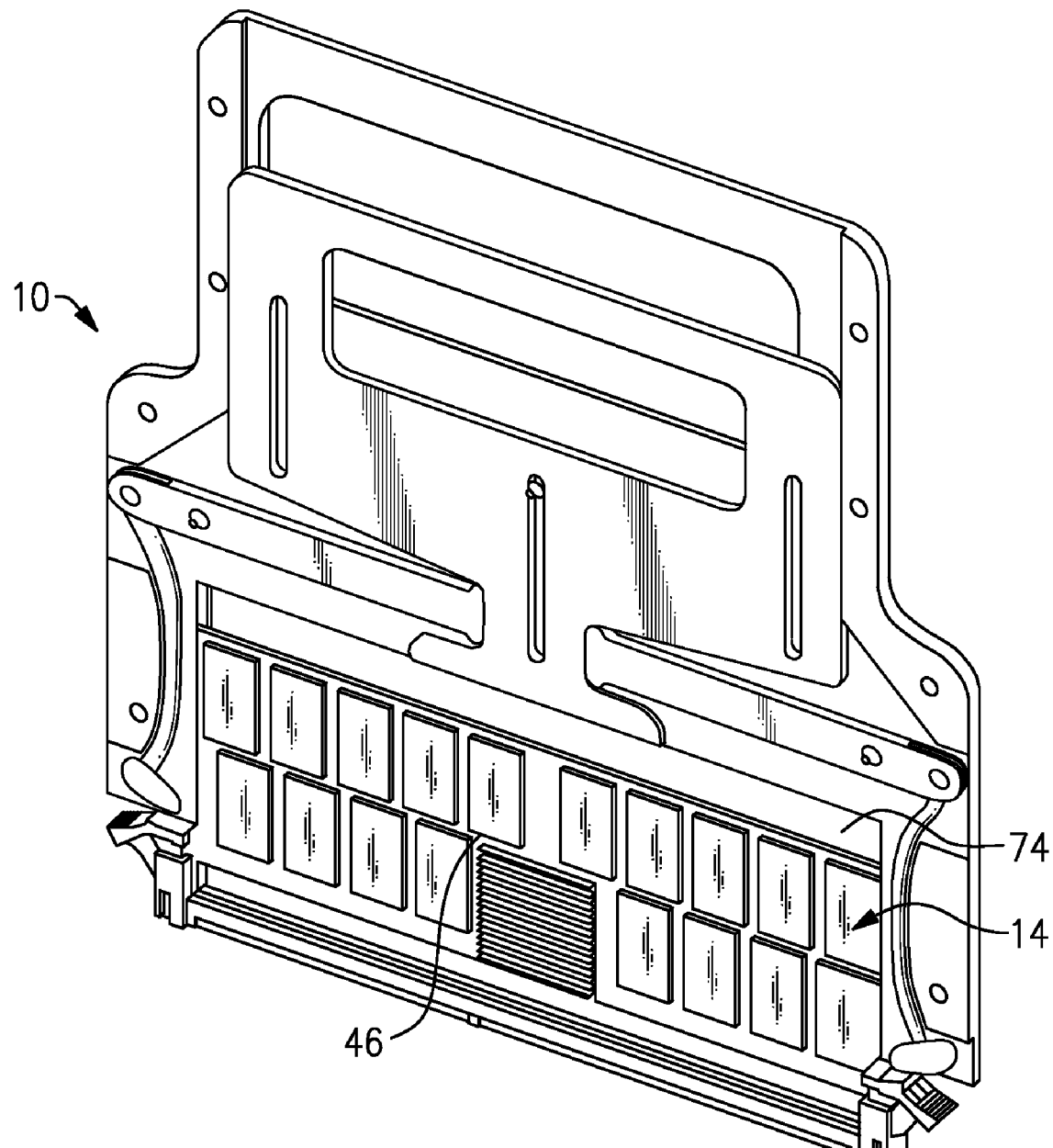
FIG. 5 is a perspective view of the article extraction/insertion tool according to the present invention during insertion of an article on a printed circuit board.

Thus far, the tool 10 has been discussed as a tool for removing an article, such as a memory module, from a printed circuit board. The tool 10 may also serve the purpose of inserting an article onto a printed circuit board. Referring now to FIG. 5, the tool 10 is essentially as shown in FIGS. 1 through 4 with the exception that tool 10 in FIG. 5 has an insert 74 which reduces the size of the article receiving portion 14. Thus, when article 46 is inserted into article receiving portion 14, article 46 protrudes from article receiving portion 14 more than it does when the article 46 is removed from the printed circuit board, thereby making insertion into the printed circuit board easier. When the tool 10 is in the insertion mode, the lever arms 26 and flexible rods 34 play no part in the insertion of the article onto a printed circuit board.

The tool 10, in the extraction mode, would be operated by aligning the tool 10 with a predetermined position on the printed circuit board (not shown) wherein an article 46 is to be removed from the printed circuit board, gripping the handle portions 12 and 18, respectively, of the housing 22 and plate 16 causing the lever arms 26 to move in a first direction 42 and the flexible rods 34 in a second direction 44, the free ends 40 of the flexible rods 34 pressing down on an article retention device 50 on the printed circuit board, receiving the article 46 from the article retention device 50 by the housing article receiving portion 14, and then removing the tool 10 and article 46 from the printed circuit board.

The tool 10, in the insertion mode, would be operated by placing an insert 74 in the housing article receiving portion 14 to reduce a size of the housing article receiving portion 14, placing an article 46 in the housing article receiving portion 14, aligning the tool 10 with a predetermined position on the printed circuit board wherein the article 46 is to be inserted on the printed circuit board, gripping the handle portions 12 and 18, respectively, of the housing 22 and plate 16, and inserting the article 46 on the printed circuit board.

Figure 6:
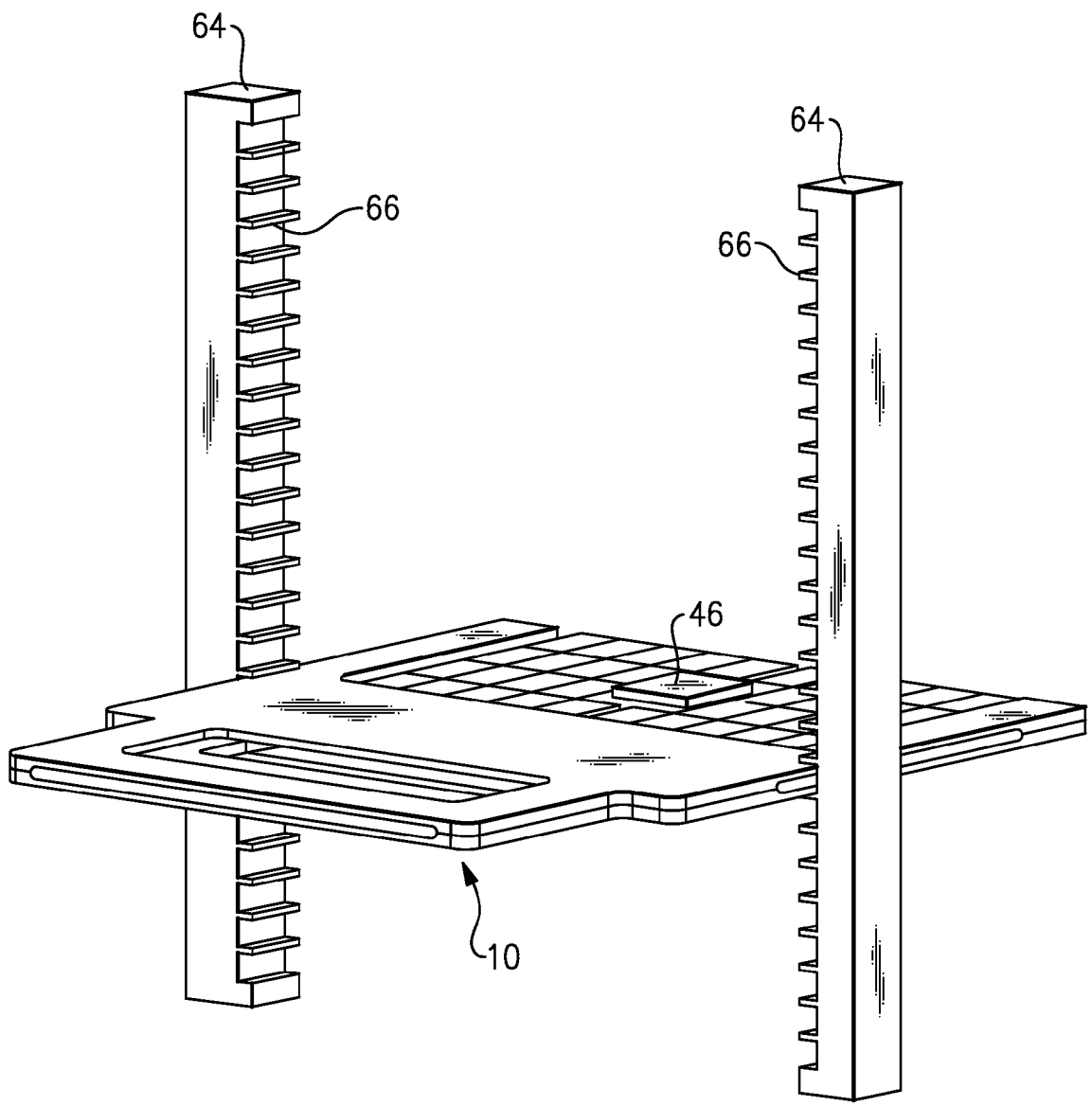
FIG. 6 is a perspective view of the article extraction/insertion tool and tool guide according to the present invention.

Referring now to FIG. 6, a further embodiment of the present invention is illustrated. Due to the high density of the connectors and articles on the printed circuit board, it may be desirable to have a guide 64 for locating the tool 10 with respect to the printed circuit board. The guide 64 can be fixed to the system frame or be placed into position only when needed. The guide 64 can be made of one piece or of two pieces. The guide 64 has slots 66 which allows for the tool to be properly aligned to the correct location on the printed circuit board for insertion or removal of an article. The guide 64 provides a greater degree of operator accuracy and removes the possibility of accidental slipping which could potentially damage adjacent articles (e.g., memory cards) or surrounding hardware.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A tool for removing an article from, or inserting an article onto, a printed circuit board, the tool comprising:
   a housing having a handle portion and an article receiving portion;
   a plate slidable within the housing, the plate having a handle portion at a first end adjacent to the handle portion of the housing and two receiving portions at a second end;
   two lever arms within the housing, each lever arm having a first end pinned to the housing and a second end of each lever arm inserted into the receiving portion of the plate such that each of the lever arms pivots about the pinned first end upon movement of the plate;
   a first flexible rod located in a recessed channel on one side of the article receiving portion in the housing, the first flexible rod affixed to the first end of one of the lever arms and a second flexible rod located in a recessed channel on another side of the article receiving portion in the housing, the second flexible rod affixed to the first end of the other of the lever arms, each of the flexible rods having a free end for interacting with an article retention device;

wherein, in operation, movement of the plate caused by gripping the handle portions of the housing and plate causes the lever arms to move in a first direction and the flexible rods in a second direction so as to cause the flexible rod free ends to interact with the article retention device.

2. The tool of claim 1 wherein the housing article receiving portion has interlocking friction teeth to hold the article in place in the housing article receiving portion.

3. The tool of claim 1 wherein each free end of the first and second flexible rods has a geared foot for interacting with the article retention device.

4. The tool of claim 1 wherein the first and second flexible rods are manufactured from a material selected from the group consisting of polycarbonate, ABS plastic, anti-static plastic and metal.

5. The tool of claim 1 wherein the housing article receiving portion comprises a pair of legs attached to a main body of the housing and the article is captured by the pair of legs.

6. The tool of claim 1 further comprising at least one insert placed within the housing article receiving portion which reduces the size of the housing article receiving portion available to receive an article.

7. The tool of claim 1 further comprising a spring attached between the plate and the housing, wherein after movement of the plate from a first position to a second position, the spring resets the plate to the first position.

8. The tool of claim 7 wherein the spring at a first end is pinned to the housing and at a second end is pinned to the plate.

9. A tool assembly for removing an article from, or inserting an article onto, a printed circuit board, the tool comprising:
   a tool comprising:
   a housing having a handle portion and an article receiving portion;
   a plate slidable within the housing, the plate having a handle portion at a first end adjacent to the handle portion of the housing and two receiving portions at a second end;
   two lever arms within the housing, each lever arm having a first end pinned to the housing and a second end of each lever arm inserted into the receiving portion of the plate such that each of the lever arms pivots about the pinned first end upon movement of the plate;
   a first flexible rod located in a recessed channel on one side of the article receiving portion in the housing, the first flexible rod affixed to the first end of one of the lever arms and a second flexible rod located in a recessed channel on another side of the article receiving portion in the housing, the second flexible rod affixed to the first end of the other of the lever arms, each of the flexible rods having a free end for interacting with an article retention device;
   and a tool guide comprising a pair of slotted members placed proximate to the article to be removed from or inserted on the printed circuit board;
   wherein, in operation, the tool is aligned with a desired portion of the printed circuit board by use of the tool guide and then the tool is operated by movement of the plate caused by gripping the handle portions of the housing and plate to cause the lever arms to move in a first direction and the flexible rods in a second direction so as to cause the flexible rod free ends to interact with the article retention device.

10. The tool of claim 9 wherein the housing article receiving portion has interlocking friction teeth to hold the article in place in the housing article receiving portion.

11. The tool of claim 9 wherein each free end of the first and second flexible rods has a geared foot for interacting with the article retention device.

12. The tool of claim 9 wherein the first and second flexible rods are manufactured from a material selected from the group consisting of polycarbonate, ABS plastic, anti-static plastic and metals.

13. The tool of claim 9 wherein the housing article receiving portion comprises a pair of legs attached to a main body of the housing and the article is captured by the pair of legs.

14. The tool of claim 9 further comprising at least one insert placed within the housing article receiving portion which reduces the size of the housing article receiving portion available to receive an article.

15. The tool of claim 9 further comprising a spring attached between the plate and the housing, wherein after movement of the plate from a first position to a second position, the spring resets the plate to the first position.

16. The tool of claim 15 wherein the spring at a first end is pinned to the housing and at a second end is pinned to the plate.

\* \* \* \* \*